United States Patent [19]

Usuki

[11] Patent Number: 5,311,075

[45] Date of Patent: May 10, 1994

[54] LEVEL SHIFTING CMOS INTEGRATED CIRCUITS

[75] Inventor: Hideki Usuki, Kanagawa, Japan

[73] Assignee: Sony Corporation, Tokyo, Japan

[21] Appl. No.: 930,247

[22] Filed: Aug. 13, 1992

[30] Foreign Application Priority Data

Aug. 22, 1991 [JP] Japan ................................. 3-237216

[51] Int. Cl.⁵ ..................... H03K 19/094; H03K 17/16
[52] U.S. Cl. ..................................... 307/443; 307/451; 307/475
[58] Field of Search .................... 307/475, 443, 451

[56] References Cited

U.S. PATENT DOCUMENTS

| | | | |
|---|---|---|---|
| 4,441,039 | 4/1984 | Schuster | 307/475 |
| 4,672,243 | 6/1987 | Kirsch | 307/475 |
| 4,716,312 | 12/1987 | Mead et al. | 307/475 |
| 4,845,381 | 7/1989 | Cuevas | 307/264 |
| 4,932,002 | 6/1990 | Houston | 365/241 |
| 5,103,121 | 4/1992 | Wendell et al. | 307/475 |

FOREIGN PATENT DOCUMENTS 0410885 1/1991 European Pat. Off. .
0411818 2/1991 European Pat. Off. .

OTHER PUBLICATIONS

"High Speed Sense Amplifier", 2244 Research Disclosure, Feb. 1988, No. 286, p. 113.

Primary Examiner—Edward P. Westin
Assistant Examiner—Richard Roseen
Attorney, Agent, or Firm—Hill, Steadman & Simpson

[57] ABSTRACT

A voltage level shifter circuit includes a pair of CMOS invertors having inputs and outputs cross connected thereto. One of a pair of power source terminals of each of the CMOS invertors is grounded, and complementary input signals are supplied to the CMOS invertors by way of the other power source terminals, and output signals are taken out from output terminals of the CMOS invertors. The voltage level shifter circuit level shifts an input amplitude substantially equal to an input threshold value of transistors to the voltage level of the power source while suppressing the dc consumption current.

2 Claims, 5 Drawing Sheets

LEVEL SHIFTING CMOS INTEGRATED CIRCUITS

BACKGROUND OF THE INVENTION

1. Field of the Invention

This invention relates to a complementary metal oxide semiconductor (CMOS) voltage shifting logic circuit characterized by low direct current power consumption and high speed switching operation.

2. Description of the Prior Art

A level shifter circuit is conventionally employed to amplify a signal of a small voltage amplitude such as, for example, an ECL level to effect shifting of a voltage level of the signal to another signal of a greater amplitude.

Exemplary ones of conventional level shifter circuits are shown in FIGS. 1 and 2. In particular, FIG. 1 shows a conventional level shifter circuit which employs a flip-flop while FIG. 2 shows another conventional level shifter circuit which employs a current mirror.

In order to assure a high driving capacity for an output load of each of the level shifter circuits shown in Figs. 1 and 2, the current driving capacity of an element employed must necessarily be high. However, since dc current flows through the level shifter circuits, if the driving capacity is increased, then the dc consumption current is increased. Accordingly, the conventional level shifter circuits have a drawback that the operating speed depends upon a trade-off with the dc consumption current.

SUMMARY OF THE INVENTION

It is an object of the present invention to provide a level shifter circuit which is low in dc current and high in operating speed.

In order to attain the object, according to one aspect of the present invention, there is provided a voltage level shifter circuit which comprises a first IGFET (insulating gate field effect transistor) of a first conductivity type connected between a first output node and a reference power source, a second IGFET of the first conductivity type connected between a second output node and the reference power source, a third IGFET of a second conductivity type opposite to the first conductivity type connected between the first output node and a first input node, and a fourth IGFET of the second conductivity type connected between the second output node and a second input node, the first output node being cross connected to the gate electrodes of the first and third IGFETs while the second output node is cross connected to the gate electrodes of the second and fourth IGFETS, complementary outputs being taken out from the first and second output nodes, and complementary inputs being applied to the first and second input nodes.

According to another aspect of the present invention, there is provided a voltage level shifter circuit which comprises first voltage dropping means and a first IGFET of a first conductivity type connected in series between a first output node and a reference power source, second voltage dropping means and a second IGFET of the first conductivity type connected in series between a second output node and the reference power source, a third IGFET of a second conductivity type opposite to the first conductivity type connected between the first output node and a first input node, and a fourth IGFET of the second conductivity type connected between the second output node and a second input node, the first output node being cross connected to the gate electrodes of the first and third IGFETs while the second output node is cross connected to the gate electrodes of the second and fourth IGFETS, complementary outputs being taken out from the first and second output nodes, and complementary inputs being applied to the first and second input nodes.

With either of the level shifter circuits, the transistor connected to the power source side to which the input signal is supplied has an increased current driving capacity while the other transistor connected to the power source of the fixed voltage side has a sufficiently low current driving capacity comparing with the transistor on the signal inputting side.

Accordingly, the input threshold value of the level shifting circuit is decreased by an amount equal to the input threshold value of the transistor connected to the power source side to which the input signal is supplied, and consequently, the stable point is moved by a small variation of the input signal. As a result, a small input amplitude is level shifted to a great output amplitude by the level shifter circuits.

BRIEF DESCRIPTION OF THE DRAWINGS

The invention is described in detail with reference to the accompanying drawings, of which.

DETAILED DESCRIPTION OF THE PREFERRED EMBODIMENTS

Figure 1:
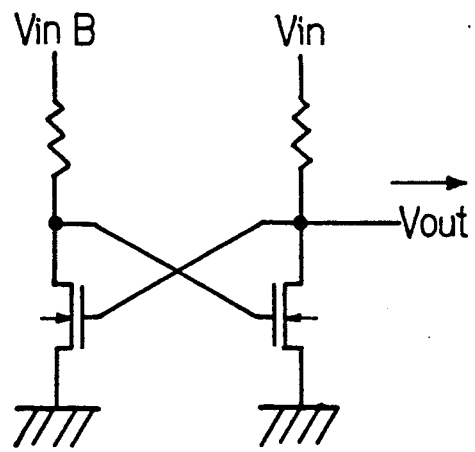
FIG. 1 is a schematic circuit diagram of an exemplary conventional digital level shifter circuit.
Figure 2:
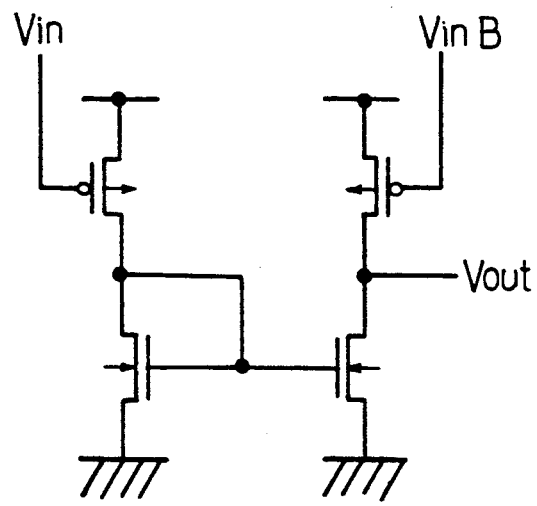
FIG. 2 is a schematic circuit diagram of another exemplary conventional digital level shifter circuit.
Figure 3A:
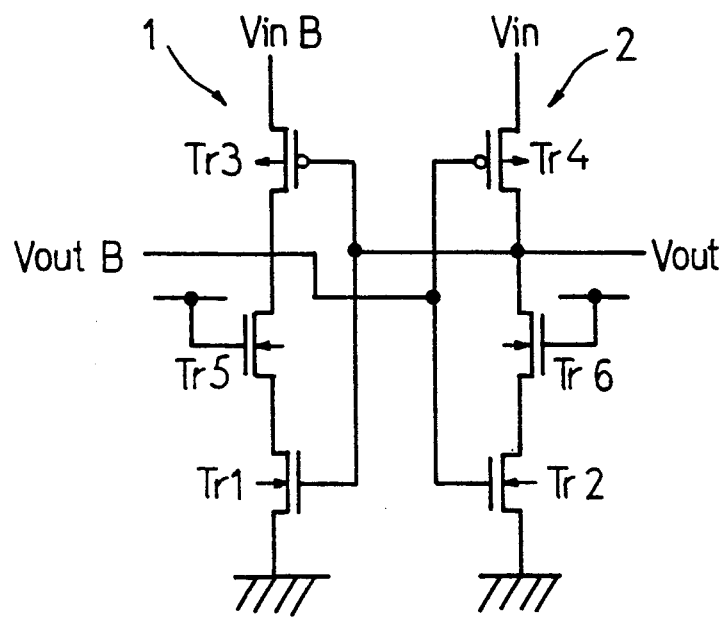
FIGS. 3A and 3B are a schematic circuit diagram and a logic diagram, respectively, of a CMOS digital level shifter circuit showing a preferred embodiment of the present invention.
Figure 3B:
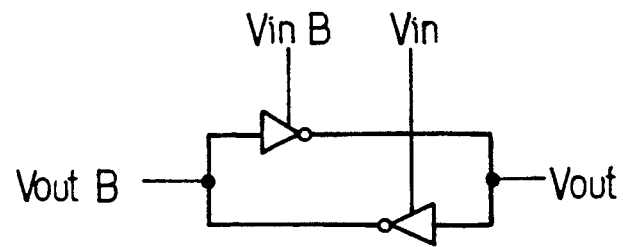

Referring first to FIGS. 3A and 3B, there is shown in schematic diagram and logic diagram, respectively, a level shifter circuit to which the present invention is applied. As can clearly be seen from FIG. 3A, the level shifter circuit shown includes a flip-flop constituted from a CMOS invertor as a basic circuit.

In particular, the level shifter circuit shown includes a first CMOS invertor 1 as a basic CMOS invertor composed of an nMOS transistor Tr1 and a pMOS transistor Tr3. Another nMOS transistor Tr5 is interposed between the nMOS transistor Tr1 and the pMOS transistor Tr3.

The level shifter circuit further includes a second CMOS invertor 2 as another basic CMOS invertor composed of an nMOS transistor Tr2 and a pMOS transistor Tr4. Another nMOS transistor Tr6 is interposed between the nMOS transistor Tr2 and the pMOS transistor Tr4.

The transistors Tr5 and Tr6 interposed in the CMOS invertors 1 and 2 are provided to limit through current which flows through the invertors 1 and 2, respectively. Meanwhile, MOS transistors having a sufficiently higher driving capacity than the thus interposed transistors Tr5 and Tr6 are used as the transistors Tr1, Tr2 and Tr3, Tr4 constituting the CMOS invertors 1 and 2, respectively.

Figure 4A:
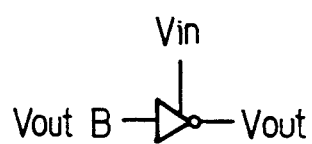
FIGS. 4A and 4B are a logic diagram and a schematic circuit diagram, respectively, of an invertor circuit included in the CMOS digital level shifter circuit shown in FIG. 3A.
Figure 4B:
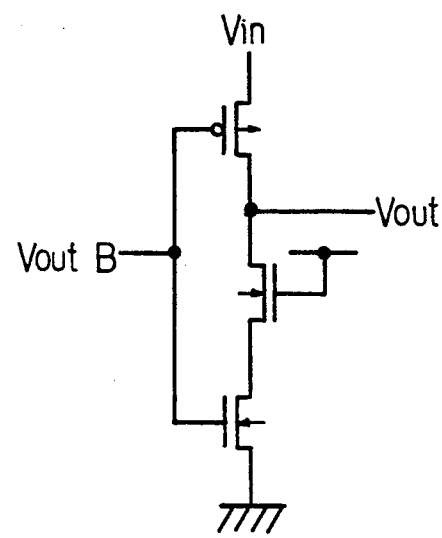
Figure 5:
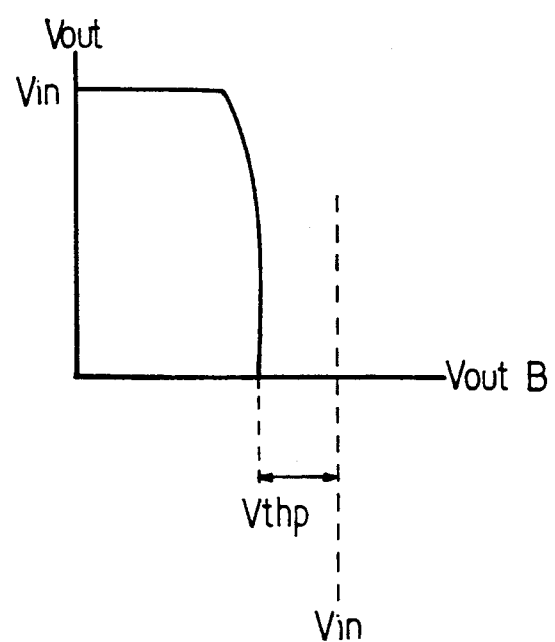
FIG. 5 is a diagram showing an input-output characteristic of the invertor circuit shown in FIG. 4B.

FIGS. 4A and 4B show in logic diagram and circuit diagram, respectively, an invertor constituting a flip-flop, and FIG. 5 shows an input-output characteristic of the invertor.

Figure 6:
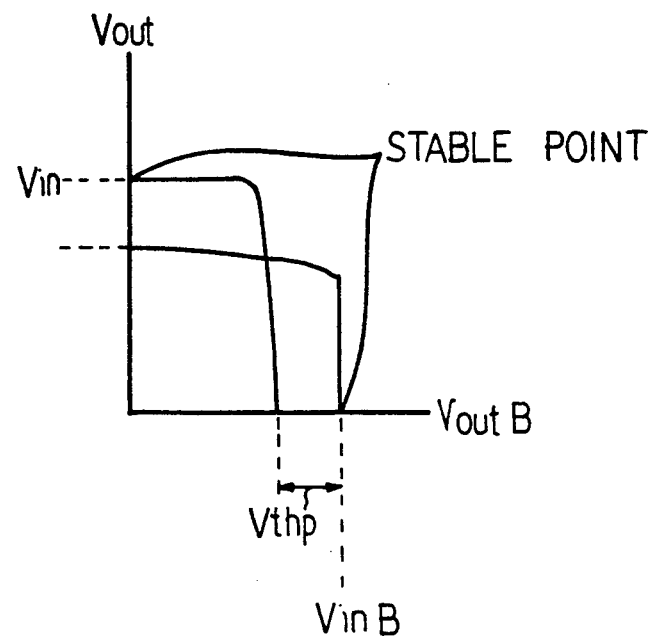
FIG. 6 is a butterfly plot diagram of a latch circuit consisting of a pair of such invertors as shown in FIG. 4B when the input voltage Vin is higher than the sum of voltages VinB and Vthp.

The input threshold value of the invertor shown in FIGS. 4A and 4B is almost equal to Vin−Vthp, where Vin is an input voltage and Vthp is a voltage Vth of a pMOS transistor. When a flip-flop is constituted using the invertor, the butterfly plot when Vin=VinB is such as shown in a characteristic diagram of FIG. 6. As can apparently be seen from FIG. 6, when Vin=VinB, there are two stable points at which data are latched.

Figure 7:
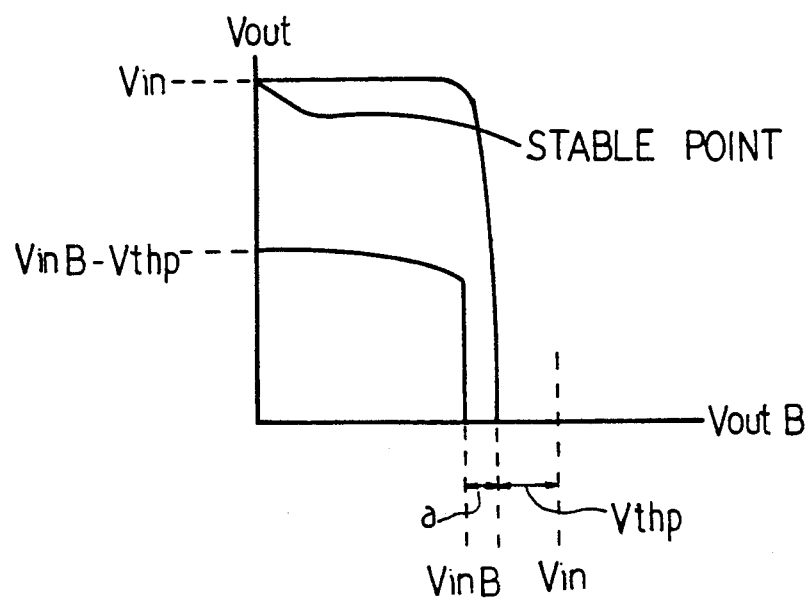
FIG. 7 is a butterfly plot diagram of the latch as shown FIG. 4B when input voltage Vin is equal to the sum of the voltages VinB, Vthp, and α.

However, when the input voltage is equal to Vin=−VinB+Vthp+α as shown in a characteristic diagram of FIG. 7, there is only one stable point, to which the output voltage moves. Accordingly, in this instance, the input amplitude Vthp+α is level shifted to the output amplitude Vin. It is to be noted that, when data are to be inverted, the voltage VinB should be set to VinB=Vin+Vthp+α.

Figure 8:
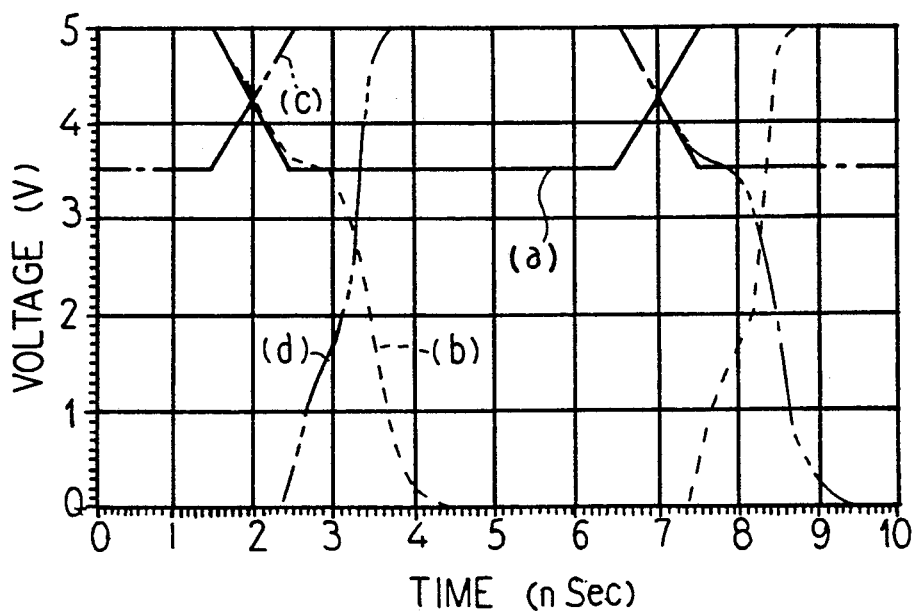
FIG. 8 is a diagram showing voltage waveforms at different locations of the circuit shown in FIG. 3A during operation.

FIG. 8 shows in waveform diagram a level shifting operation of the level shifter circuit shown in FIG. 3A. Referring to FIG. 8, a characteristic curve (a) indicates Vin while a broken line characteristic curve (b) indicates Vout. Meanwhile, a further characteristic curve (c) shown by an alternate long and short dash line indicates VinB while a still further characteristic curve (d) shown by an alternate long and two short dashes line indicates VoutB. As can apparently be seen from FIG. 8, the level shifter circuit of the present embodiment shifts the level of an input amplitude of 1.4 volts or so to an output amplitude of 5 volts.

Since level shifting is performed in such a manner as described above, the level shifter circuit of the present embodiment has the following characteristics. In particular, (1) dc consumption current will not flow: (2) an output driving capacity for a next stage can be increased by increasing the current driving capacity of each transistor element, and high speed operation can be achieved without paying attention to dc current; (3) however, an input amplitude higher than Vthp is required and the input sensitivity cannot be set to a value lower than Vthp; and (4) the output amplitude will fully swing from the input voltage levels Vin and VinB to the ground GND.

Figure 9:
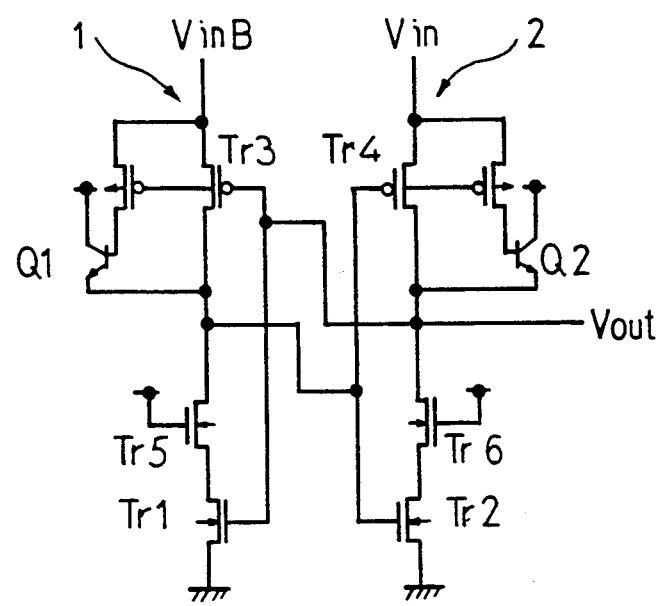
FIG. 9 is a schematic diagram of a BICMOS digital level shifter circuit showing another preferred embodiment of the present invention.

FIG. 9 shows a modification to the level shifter circuit shown in FIGS. 3A and 3B. Referring to FIG. 9, the modified level shifter circuit shown additionally includes a pair of bipolar transistors Q1 and Q2 provided for the pull-up pMOS transistors Tr3 and Tr4, respectively, to assure an increased output driving capacity. In such a circuit which does not include the bipolar transistors Q1 and Q2 as the circuit shown in FIG. 3, in order to raise the speed of an output pulling up operation, the pMOS transistors Tr3 and Tr4 must be increased considerably in size. However, where such bipolar transistors Q1 and 02 are additionally provided as in the circuit shown in FIG. 9, a higher speed operation of the pMOS transistors Tr3 and Tr4 can be achieved without increasing the sizes of them.

Having now fully described the invention, it will be apparent to one of ordinary skill in the art that many changes and modifications can be made thereto without departing from the spirit and scope of the invention as set forth herein.

What is claimed is:

1. A voltage level shifter circuit, comprising:
   a first IGFET of a first conductivity type connected between a first output node and a reference power source;
   a second IGFET of the first conductivity type connected between a second output node and a reference power source;
   a third IGFET of a second conductivity type opposite to the first conductivity type connected between said first output node and a first input node;
   a fourth IGFET of the second conductivity type connected between said second output node and a second input node;
   a fifth IGFET of which the source is connected to said first input node and the gate electrode of said third IGFET;
   a first bipolar transistor of which the base is connected to the drain of said fifth IGFET, the emitter is connected to said first output node and the collector is connected to a second power source;
   a sixth IGFET of which the source is connected to said second input node and the gate electrode is connected to the gate electrode of said fourth IGFET;
   a second bipolar transistor of which the base is connected to the drain of said sixth IGFET, the emitter is connected to said second output node, and the collector is connected to said second power source;
   said first output node being cross connected to the gate electrode of said first and third IGFETs while said second output node is cross connected to the gate electrode of said second and fourth IGFETs;
   complementary outputs being taken out from said first and second output nodes; and
   complementary inputs being applied to said first and second input nodes.

2. A voltage level shifter circuit, comprising:
   first voltage dropping means and a first IGFET of a first conductivity type connected in series between a first output node and a reference power source;
   second voltage dropping means and a second IGFET of the first conductivity type connected in series between a second output node and said reference power source;
   a third IGFET of a second conductivity type opposite to the first conductivity type connected between said first output node and a first input node;
   a fourth IGFET of the second conductivity type connected between said second output node and a second input node;
   a fifth IGFET of which the source is connected to said first input node and the gate electrode of said third IGFET;

a first bipolar transistor of which the base is connected to the drain of said fifth IGFET, the emitter is connected to said first output node and the collector is connected to a second power source;

a sixth IGFET of which the source is connected to said second input node and the gate electrode is connected to the gate electrode of said fourth IGFET;

a second bipolar transistor of which the base is connected to the drain of said sixth IGFET, the emitter is connected to said second output node, and the collector is connected to said second power source;

said first output node being cross connected to the gate electrode of said first and third IGFETs while said second output node is cross connected to the gate electrode of said second and fourth IGFETs;

complementary outputs being taken out from said first and second output nodes; and complementary inputs being applied to said first and second input nodes.

* * * * *